(12) United States Patent
Jiang et al.

(10) Patent No.: US 9,368,360 B2
(45) Date of Patent: Jun. 14, 2016

(54) ANTI-DIFFUSION LAYER, PREPARATION METHOD THEREOF, THIN-FILM TRANSISTOR (TFT), ARRAY SUBSTRATE, DISPLAY DEVICE

(71) Applicant: BOE TECHNOLOGY GROUP CO., LTD., Beijing (CN)

(72) Inventors: Chunsheng Jiang, Beijing (CN); Haijing Chen, Beijing (CN); Dongfang Wang, Beijing (CN)

(73) Assignee: BOE TECHNOLOGY GROUP CO., LTD, Beijing (CN)

( * ) Notice: Subject to any disclaimer, the term of this patent is extended or adjusted under 35 U.S.C. 154(b) by 0 days.

(21) Appl. No.: 14/345,607

(22) PCT Filed: May 31, 2013

(86) PCT No.: PCT/CN2013/076591
§ 371 (c)(1),
(2) Date: Mar. 18, 2014

(87) PCT Pub. No.: WO2014/176811
PCT Pub. Date: Nov. 6, 2014

(65) Prior Publication Data
US 2014/0319529 A1 Oct. 30, 2014

(30) Foreign Application Priority Data

Apr. 28, 2013 (CN) .......................... 2013 1 0154410

(51) Int. Cl.
*H01L 21/288* (2006.01)
*H01L 27/12* (2006.01)
(Continued)

(52) U.S. Cl.
CPC .............. *H01L 21/2885* (2013.01); *C25D 9/06* (2013.01); *H01L 21/02183* (2013.01);
(Continued)

(58) Field of Classification Search
CPC ................... H01L 21/02183; H01L 21/02258;
H01L 21/2885; H01L 29/4908; H01L 29/517;
C25D 9/06; C25D 13/02
See application file for complete search history.

(56) References Cited

U.S. PATENT DOCUMENTS 5,334,544 A * 8/1994 Matsuoka et al. ............ 438/158
5,468,987 A 11/1995 Yamazaki et al.
(Continued)

FOREIGN PATENT DOCUMENTS

CN 101295666 A * 10/2008
CN 201310154410.7 8/2013
(Continued)

OTHER PUBLICATIONS

International Search Report, International Preliminary Report on Patentability and Written Opinion of the International Searching Authority of PCT/CN2013/076591 in Chinese mailed Jan. 23, 2014.
(Continued)

*Primary Examiner* — Fernando L Toledo
*Assistant Examiner* — Christine L Hagan
(74) *Attorney, Agent, or Firm* — Collard & Roe, P.C.

(57) ABSTRACT

An anti-diffusion layer, a preparation method thereof, a thin-film transistor (TFT), an array substrate and a display device are provided, involve the display device manufacturing field and can resolve problem that a high atmosphere temperature is need in process of preparing a tantalum dioxide anti-diffusion layer by PVD or CVD, which causes the gate electrode to volatilize and affect the performance of a display device. The method for preparing the anti-diffusion layer comprises: placing a conductive base (1) and a cathode (4) in a electrolytic solution (3), taking the conductive base (1) as an anode, and forming a tantalum dioxide anti-diffusion layer on the conductive base (1) after energizing.

6 Claims, 1 Drawing Sheet

(51) Int. Cl.
   *C25D 9/08*     (2006.01)
   *H01L 21/02*    (2006.01)
   *H01L 29/49*    (2006.01)
   *H01L 29/51*    (2006.01)
   *C25D 9/06*     (2006.01)

(52) U.S. Cl.
   CPC ..... *H01L 21/02258* (2013.01); *H01L 27/1237* (2013.01); *H01L 27/1292* (2013.01); *H01L 29/4908* (2013.01); *H01L 29/517* (2013.01)

(56) References Cited

U.S. PATENT DOCUMENTS

| | | | |
|---|---|---|---|
| 6,049,092 | A | 4/2000 | Konuma et al. |
| 7,902,602 | B2 | 3/2011 | Koo et al. |
| 2002/0102848 | A1* | 8/2002 | Xiang et al. ............... 438/682 |
| 2004/0188682 | A1* | 9/2004 | Hirai ..................... 257/59 |
| 2011/0177692 | A1* | 7/2011 | Wang et al. ............... 438/704 |
| 2011/0220884 | A1 | 9/2011 | Saito et al. |

FOREIGN PATENT DOCUMENTS

| | | |
|---|---|---|
| JP | 2001-264812 | 9/2001 |
| JP | 2006-013468 | 1/2006 |
| JP | 2011-035430 | 2/2011 |
| KR | 10-2011-0069772 | 6/2011 |

OTHER PUBLICATIONS

Korean Office Action for KR10-2014-7009938 (Related Application) dated Apr. 1, 2015 in Korean with English Translation.
English Translation of the International Search Report of PCT/CN2013/076591 Application Published on Nov. 6, 2014.
English translation of the International Preliminary Report on Patentability and Written Opinion of the International Searching Authority of PCT/CN2013/076591, issued Nov. 3, 2015.

\* cited by examiner

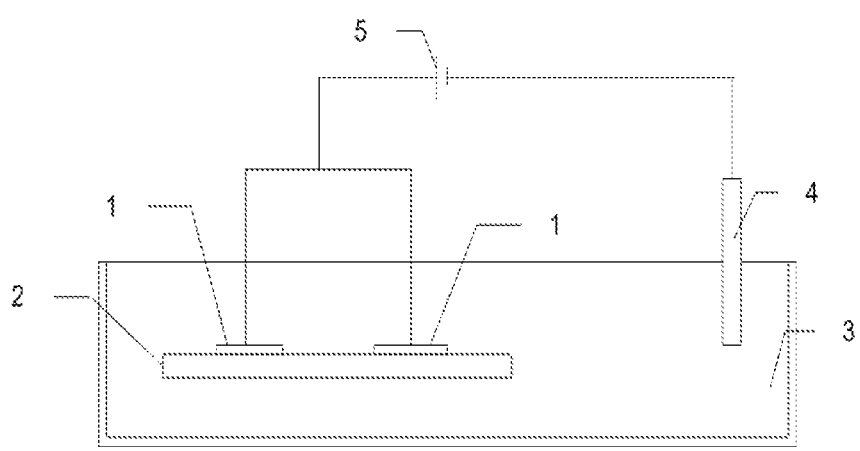

ANTI-DIFFUSION LAYER, PREPARATION METHOD THEREOF, THIN-FILM TRANSISTOR (TFT), ARRAY SUBSTRATE, DISPLAY DEVICE

CROSS REFERENCE TO RELATED APPLICATIONS

This application is the National Stage of PCT/CN2013/076591 filed on May 31, 2013, which claims priority under 35 U.S.C. §119 of Chinese Application No. 201310154410.7 filed on Apr. 28, 2013, the disclosure of which is incorporated by reference. The international application under PCT article 21(2) was not published in English.

TECHNICAL FIELD

Embodiments of the present invention relate to an anti-diffusion layer, a preparation method thereof, a thin-film transistor (TFT), an array substrate and a display device.

BACKGROUND

As a thin film transistor (TFT) is a kind of key control unit for a display, the performances of the TFT are particularly important. In preparation processes of amorphous silicon thin-film transistors (a-Si TFTs), molybdenum (Mo) metal or molybdenum/aluminum-neodymium (Mo/AlNd) alloy is generally used for preparing a gate electrode. However, as the resistance of Mo metal or Mo/AlNd alloy is relatively high, in the process of manufacturing a large-size display, the current in a central portion of a display area may be less than that in a peripheral portion, and hence the problem of nonuniform displayed image may occur.

In order to solve the above problem, a low-resistance material (such as copper or aluminum) is mostly employed for a gate electrode and applied to the process of manufacturing a large-size display. However, as the low-resistance material has low adhesion with a substrate and a semiconductor, the problem of poor contact with an electrode material tends to occur. Moreover, the low-resistance material can react with silicon at a relatively low temperature and then be diffused to an active layer, and hence the performances of a device can be disadvantageously affected. The low-resistance material, e.g., copper, the electric resistivity of which is only 2 μΩ·cm, presents significant superiority as an electrode material.

Therefore, an anti-diffusion layer must be prepared on the low-resistance material. Currently, a metal with high melting point and an oxide or nitride thereof are commonly used for the anti-diffusion layer. In the application, tantalum dioxide (TaO2) with good anti-diffusion performance is usually selected to prepare an anti-diffusion layer. The preparation method usually adopts physical vapor deposition (PVD) or chemical vapor deposition (CVD).

SUMMARY

Embodiments of the present invention provide a tantalum dioxide anti-diffusion layer prepared at normal temperature, a preparation method thereof, a thin film transistor, an array substrate and a display device.

In one aspect, the present invention provides a method for preparing an anti-diffusion layer, which comprises: placing a conductive base and a cathode in a electrolytic solution, taking the conductive base as an anode, and forming a tantalum dioxide anti-diffusion layer on the conductive base after energizing.

In the method, for instance, the conductive base is copper or aluminum.

In the method, for instance, the conductive base is a gate electrode of a thin film transistor.

In the method, for instance, the electrolytic solution is a tantalum sulfate solution; the mass concentration of the tantalum sulfate solution is ranged from 6 to 9 percent; and the pH value is between 8 and 10.

In the method, for instance, the energizing voltage is ranged from 10 to 30 V; the energizing current is ranged from 30 to 100 mA; and the energizing time is 8 to 12 s.

In the method, for instance, the electrolytic solution also includes a catalyst; the catalyst is methanol; and the mass concentration of methanol is ranged from 10 to 15 percent.

BRIEF DESCRIPTION OF THE DRAWINGS

Simple description will be given below to the accompanying drawings of the embodiments to provide a more clear understanding of the technical proposals of the embodiments of the present invention. It will be obvious to those skilled in the art that the drawings described below only involve some embodiments of the present invention but are not intended to limit the present invention.

FIG. 1 is a schematic diagram illustrating the process of the method for preparing the tantalum dioxide anti-diffusion layer provided by a first embodiment of the present invention.

REFERENCE NUMERALS

1. Conductive Base; 2. Substrate; 3. Electrolytic Solution; 4. Graphite Electrode; 5. Power Supply.

DETAILED DESCRIPTION

For more clear understanding of the objectives, technical proposals and advantages of the embodiments of the present invention, clear and complete description will be given below to the technical proposals of the embodiments of the present invention with reference to the accompanying drawings of the embodiments of the present invention. It will be obvious to those skilled in the art that the preferred embodiments are only partial embodiments of the present invention but not all the embodiments. All the other embodiments obtained by those skilled in the art without creative efforts on the basis of the embodiments of the present invention illustrated shall fall within the scope of protection of the present invention.

The inventor found that: when the tantalum dioxide anti-diffusion layer is prepared by PVD or CVD process, the temperature required by the process is relatively high and is usually between 250 and 500 centigrade; therefore, when the tantalum dioxide anti-diffusion layer of the gate electrode of a TFT is prepared by the method, the low-resistance material tend to volatilize, and hence the thickness of the gate electrode is reduced and the electrical conductivity is poor, and consequently the performance of a display device can be affected.

Embodiment 1:

The embodiment provides a method for preparing an anti-diffusion layer. As illustrated in FIG. 1, the method comprises: taking a conductive base 1 as an anode and placing the conductive bases 1 in a tantalum sulfate solution (namely an electrolytic solution 3); taking a graphite electrode 4 (of course, other electrodes may also be used) as a cathode and placing the graphite electrode 4 in the electrolytic solution 3; and forming the tantalum dioxide anti-diffusion layer on the conductive bases 1 by an anode oxidation method after energizing (an electrical current is allowed to pass through).

In the process of preparing an array substrate, for instance, applied to a liquid crystal display (LCD), the conductive base 1 is preferably a gate electrode of a TFT on a substrate 2 and made of a low-resistance material. The embodiment uses copper for example.

For instance, the mass concentration of the tantalum sulfate solution is ranged from 6 to 9 percent; and meanwhile the pH value of the tantalum sulfate solution is strictly controlled to be between 8 and 10 by utilization of ammonia water, and hence the problem that the conductive bases 1 are eroded can be prevented. An alternating-current (AC) supply 5 is preferably adopted for energizing; the growth rate of 2V/s is adopted to increase the input voltage; the input voltage is controlled to be between 10 and 30 V; and the input current is controlled to be between 30 and 100 mA. It should be noted that the power supply 5 may also adopt a direct current (DC) supply. But the defect is that the DC supply can increase the temperature of the electrolytic solution 3 in the operation process.

A tantalum metal film is shortly formed on the conductive base 1, namely the gate electrode of the TFT, by means of electrophoresis, and the thickness of the tantalum metal film is approximately 20 nm Subsequently, with the continuous increase of voltage, the tantalum metal film acquires more free energy, reacts with oxygen elements in the electrolytic solution 3, and continuously forms a tantalum dioxide film. For instance, the reaction time is preferably 8 to 12 s, more preferably 10 s. The increase of the anode oxidation time can improve the compactness of the tantalum dioxide film but has little effect on the film thickness. In general, the thickness of the formed tantalum dioxide film is at least 20 nm. The thickness is enough to prevent the diffusion of metal ions. In actual production, the thickness of the tantalum dioxide anti-diffusion layer may also be set to be more than 20 nm according to actual situations.

It should be also noted that: the anode oxidation method is a known chemical reaction method. In the implementation of the embodiment of the present invention, corresponding reaction parameters (pH value, voltage, current, time and the like) may be adjusted by those skilled in the art as required, but the parameters and the parameter ranges in the embodiment are not construed as the limits to the present invention.

Preferably, in one example, the electrolytic solution 3 in the embodiment may further include a catalyst. The catalyst may be methanol, and the mass concentration of methanol is, for instance, ranged from 10 to 15 percent.

In the embodiment, the tantalum dioxide anti-diffusion layer is prepared at the room temperature, so that the problem that the performance of the display is affected by the volatilization of the gate electrode material in the traditional method for preparing the tantalum dioxide anti-diffusion layer can be avoided. Moreover, as the devices adopted by the preparation method are simple, the capital investment can be low; and because both the voltage and the current required are low, the energy consumption can be effectively reduced.

It should be understood that although the embodiment uses copper as the conductive base 1, other low-resistance material such as aluminum may also be used as the conductive base 1.

Embodiment 2

The embodiment provides an anti-diffusion layer. The anti-diffusion layer is prepared by the method provided by the embodiment 1, and is a tantalum dioxide anti-diffusion layer.

As the anti-diffusion layer of the embodiment is prepared by the above method, the volatilization of the low-resistance material cannot occur during the preparation, and hence the performance of the display cannot be affected.

Embodiment 3

The embodiment provides a TFT, which comprises a gate electrode disposed on a substrate. The anti-diffusion layer is formed on the gate electrode; and meanwhile, other known structures such as a gate insulating layer, a source/drain metal layer, an active layer, a passivation layer and a pixel electrode may also be formed on the substrate.

In the TFT of the embodiment, the gate electrode is preferably made of a copper or aluminum material.

As the anti-diffusion layer is formed on the gate electrode of the TFT of the embodiment, the diffusion of copper or aluminum ions to the gate insulating layer can be effectively prevented, and hence the diffusion of the copper or aluminum ions to the active layer can be prevented, and consequently the electrical conductivity of the TFT can be effectively guaranteed.

The TFT of the embodiment is preferably of a bottom-gate type. As for the bottom-gate type TFT, as the gate electrode of the bottom-gate type TFT is formed before the gate insulating layer is formed, the gate electrode may be directly employed as the conductive base, which is helpful to the preparation process.

It should be further noted that the TFT may be a monocrystalline silicon TFT or a polycrystalline silicon TFT and may also be a metal oxide TFT.

Embodiment 4

The embodiment provides an array substrate, which comprises any foregoing TFT. As the performance of the TFT is improved, the performances of the array substrate can also be improved correspondingly.

Embodiment 5

The embodiment further provides a display device, which comprises any foregoing array substrate. The display device may be: any product or component with display function such as an LCD panel, electronic paper, an organic light-emitting diode (OLED) panel, a mobile phone, a tablet PC, a television, a display, a notebook PC, a digital picture frame and a navigator.

The foregoing is only the preferred embodiments of the present invention and not intended to limit the scope of protection of the present invention. The scope of protection of the present invention should be defined by the appended claims.

The invention claimed is:

1. A method for preparing an anti-diffusion layer, comprising:
   placing a conductive base and a cathode in an electrolytic solution, taking the conductive base as an anode, and forming a tantalum dioxide anti-diffusion layer on the conductive base after energizing, wherein the electrolytic solution is a tantalum sulfate solution; a mass concentration of the tantalum sulfate solution is ranged from 6 to 9 percent; and the pH value is between 8 and 10, wherein the electrolytic solution also includes a catalyst; the catalyst is methanol; and the mass concentration of methanol is ranged from 10 to 15 percent.

2. The method for preparing the anti-diffusion layer according to claim 1, wherein the conductive base is made of copper or aluminum.

3. The method for preparing the anti-diffusion layer according to claim 1, wherein the conductive base is a gate electrode of a thin-film transistor (TFT).

4. The method for preparing the anti-diffusion layer according to claim 3, wherein the energizing voltage is ranged from 10 to 30 V; the energizing current is ranged from 30 to 100 mA; and the energizing time is 8 to 12 s.

5. The method for preparing the anti-diffusion layer according to claim 2, wherein the conductive base is a gate electrode of a thin-film transistor (TFT).

6. The method for preparing the anti-diffusion layer according to claim 5, wherein the energizing voltage is ranged from 10 to 30 V; the energizing current is ranged from 30 to 100 mA; and the energizing time is 8 to 12 s.

* * * * *